US007408593B2

(12) United States Patent
Narita

(10) Patent No.: US 7,408,593 B2
(45) Date of Patent: Aug. 5, 2008

(54) DIGITAL TELEVISION BROADCAST SIGNAL RECEIVER

(75) Inventor: Shusuke Narita, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 636 days.

(21) Appl. No.: 11/116,405

(22) Filed: Apr. 28, 2005

(65) Prior Publication Data

US 2005/0245219 A1 Nov. 3, 2005

(30) Foreign Application Priority Data

Apr. 28, 2004 (JP) ............................ 2004-132340

(51) Int. Cl.
*H04N 5/44* (2006.01)

(52) U.S. Cl. ....................... 348/725; 348/729; 348/731; 348/732; 348/570; 725/72

(58) Field of Classification Search ................. 348/725, 348/729, 731, 732, 570, 705, 706, 720; 455/193.1, 455/184.1; 725/72; 343/876, 751; 375/267, 375/299, 347

See application file for complete search history.

(56) References Cited

U.S. PATENT DOCUMENTS 6,697,610 B1 * 2/2004 Tait ......................... 455/277.1
6,867,819 B2 * 3/2005 Lee ............................ 348/725
7,136,113 B2 * 11/2006 Lee ............................ 348/725
7,286,190 B2 * 10/2007 Klopfenstein et al. ........ 348/569
7,295,254 B2 * 11/2007 Bendov ...................... 348/836
2004/0248517 A1 * 12/2004 Reichgott et al. .......... 455/63.4

FOREIGN PATENT DOCUMENTS

JP 10-233969 9/1998
JP 2000-269786 9/2000
JP 2002-335458 11/2002
JP 2002-353832 12/2002

* cited by examiner

*Primary Examiner*—David Ometz
*Assistant Examiner*—Jean W Désir
(74) *Attorney, Agent, or Firm*—Crowell & Moring LLP

(57) ABSTRACT

In a digital TV broadcast signal receiver connected to a multi-directional antenna called smart antenna, even when a user reshuffles a channel frequently, it is aimed to shorten a time delay between channel choice by the user and switching operation of the multi-directional antenna for switching signal receiving direction. Initially, sensitivities of TV broadcast signals of all receivable channels in all signal receiving directions are measured and measurement results are memorized in a memory. A signal receiving direction, in which a number of receivable channels is the largest, is decided as an optimum signal receiving direction with respect to each receivable channel. Even when the channel is reshuffled among these receivable channels, it is no need to switch the signal receiving direction of the multi-directional antenna. Consequently, the time for switching the signal receiving direction of the multi-directional antenna can be reduced even when the channels are reshuffled frequently.

5 Claims, 3 Drawing Sheets

DIGITAL TELEVISION BROADCAST SIGNAL RECEIVER

BACKGROUND OF THE INVENTION

1. Field of the Invention

The present invention relates to a digital television (TV) broadcast signal receiver that can receive digital television broadcast signals such as ATSC (Advanced television systems Committee).

2. Description of the Related Art

In the North American Continent where an ATSC digital television broadcast (it is abbreviated to a hereinafter digital TV broadcast) is performed, plains are dotted with metropolises, so that various digital TV broadcast signals broadcasted in the suburbs of each metropolis can be received at other cities or the halfway point of the cities. In consideration from a user who receives the TV broadcast signals, since many TV broadcast signals are transmitted in various directions, it is necessary to regulate a direction of an antenna in an orientation to a TV broadcasting station from which a program which he wants to watch is delivered. Therefore, a multi-directional antenna such as a smart antenna is put into practical use.

As described in Japanese Laid-Open Patent Publication No. 10-233969, the TV broadcast signal receiver is generally set preferentially to receive a channel with a higher sensitivity of a TV broadcast signal. In Japanese Laid-open Patent Publication No. 2002-335458, a digital TV broadcast signal receiver displays numbers of receivable channels in different colors corresponding to sensitivities of TV broadcast signals, for visually indicating signal receiving conditions to the user. In Japanese Laid-Open Patent Publication No. 2002-353832, field strength of received TV broadcast signals and error rates of digital data are used to set a receive direction of an antenna in a digital TV broadcast receiver. In Japanese Laid-Open Patent Publication No. 2000-269786, which relates to FM broadcasting, in an area having many broadcast stations channels with low noise broadcast signals are selected, and in another area having a few broadcast stations, the conditions for noise of the broadcast signals is sweetened in order to increase a number of channels selectable.

According to the EIA-909 technical standard, it is provided that a smart antenna has sixteen signal receiving directions in respective directions where a circle is divided into sixteen. A digital TV broadcast signal receiver in compliance with the EIA-909 technical standard can adjust the signal receiving direction of the multi-directional antenna such as the smart antenna in all sixteen signal receiving directions.

By the way, there are many types of the multi-directional antenna, for example, a type for rotating an antenna with a motor for switching the signal receiving direction, or a type with a plurality of antennas and electronic switches in which a signal receiving direction is switched by switching on and off of the electronic switches. A term necessary for switching the signal receiving direction of the multi-directional antenna due to switching on and off of the electronic switches is approximately 10 ms extent with no relation in model. In contrast, a term necessary for switching the signal receiving direction of the multi-directional antenna in which the antenna is rotated with the motor is uneven in a range from 100 ms to 200 ms extent due to power of the motor and angle of rotation of the antenna. When the digital TV broadcast signal receiver has no function for distinguishing the kinds of the connected multi-directional antennas or for setting a term for switching the signal receiving direction optionally, the term for switching the signal receiving direction of the digital TV broadcast signal receiver is set to the longest term necessary for switching the signal receiving direction of the multi-directional antenna among the ones available in the market.

In general, a direction having the highest sensitivity of the TV broadcast signal among the directions in which the TV broadcast signal can be received is defined as an optimum signal receiving direction with respect to each channel. Then, the switching operation of the TV broadcast signal receiver is performed whenever a user chooses a channel so that the signal receiving direction of the multi-directional antenna is switched to the optimum signal receiving direction of the channel which is selected by the user. While a term for switching the signal receiving direction of the digital TV broadcast signal receiver, no image is displayed on a monitor screen, and the switching of the channel will be delayed. Especially when the user reshuffles the channel frequently, the switching operation of the signal receiving direction of the multi-directional antenna cannot catch up with the channel reshuffling operation, and it causes the irritation of the user.

SUMMARY OF THE INVENTION

A purpose of the present invention is to provide a digital TV broadcast signal receiver connected to a multi-directional antenna, by which a time delay between the channel choice by the user and the switching of the signal receiving direction of the multi-directional antenna can be shortened owing to reduce a number of times for switching the signal receiving directions of the multi-directional antenna, when the signal receiving direction of the multi-directional antenna is switched to the optimum signal receiving direction with respect to a channel which is chosen by the user.

A digital TV broadcast signal receiver in accordance with an aspect of the present invention connected to a multi-directional antenna having a plurality of signal receiving directions in compliance with a predetermined technical standard receives a digital television broadcast signal by making a signal receiving direction among a plurality of signal receiving directions effective.

The digital TV broadcast signal receiver comprises a tuner for receiving digital television broadcast signal through the multi-directional antenna, and a controller for switching signal receiving directions of the multi-directional antenna, The controller further searches channels normally receivable in each signal receiving direction of the multi-directional antenna while switching the signal receiving directions of the multi-directional antenna, compares a number of channels normally receivable in each signal receiving direction, and decides a signal receiving direction having the largest number of other channels normally receivable in the same signal receiving direction as an optimum signal receiving direction with respect to each channel.

By such a configuration, when the digital TV broadcast signal can be received in a plurality of signal receiving directions in the digital TV broadcast signal receiver, a signal receiving direction, in which the number of other channels normally receivable is the largest, is decided as an optimum signal receiving direction of the channel to be received, instead of the signal receiving direction having the most high sensitivity of the digital TV broadcast signal. Thus, even when the user reshuffles the channel, it is not necessary to switch the signal receiving direction of the multi-directional antenna, according to the channel to be changed. As a result, a number of times for switching the signal receiving direction of the multi-directional antenna can be reduced, and a time delay between the channel choice of the user and the switching operation of the signal receiving direction of the multi-directional antenna can be shortened.

It is possible that the controller measures a sensitivity of digital television broadcast signal of each channel, compares a value of measured sensitivity with a predetermined threshold value, and decides the channel normally receivable when the value of measured sensitivity is equal to or larger than the threshold value.

Furthermore, it is possible that the controller counts a number of channels normally receivable in each signal receiving direction, compares the numbers of channels normally receivable including a channel to which an optimum signal receiving direction is to be decided, and decides a signal receiving direction showing the largest number of channels normally receivable as the optimum signal receiving direction of the channel.

Still furthermore, it is possible that when the channel is switched by a user, the controller judges whether the channel to be switched is normally receivable in the signal receiving direction set before the channel is switched, or not; when the channel to be switched is normally receivable, the controller does not switch the signal receiving direction of the multi-directional antenna, and when the channel to be switched is not normally receivable, the controller switches the signal receiving direction of the multi-directional antenna to the optimum signal receiving direction of the channel to be switched.

DETAILED DESCRIPTION OF THE EMBODIMENT

Figure 1:
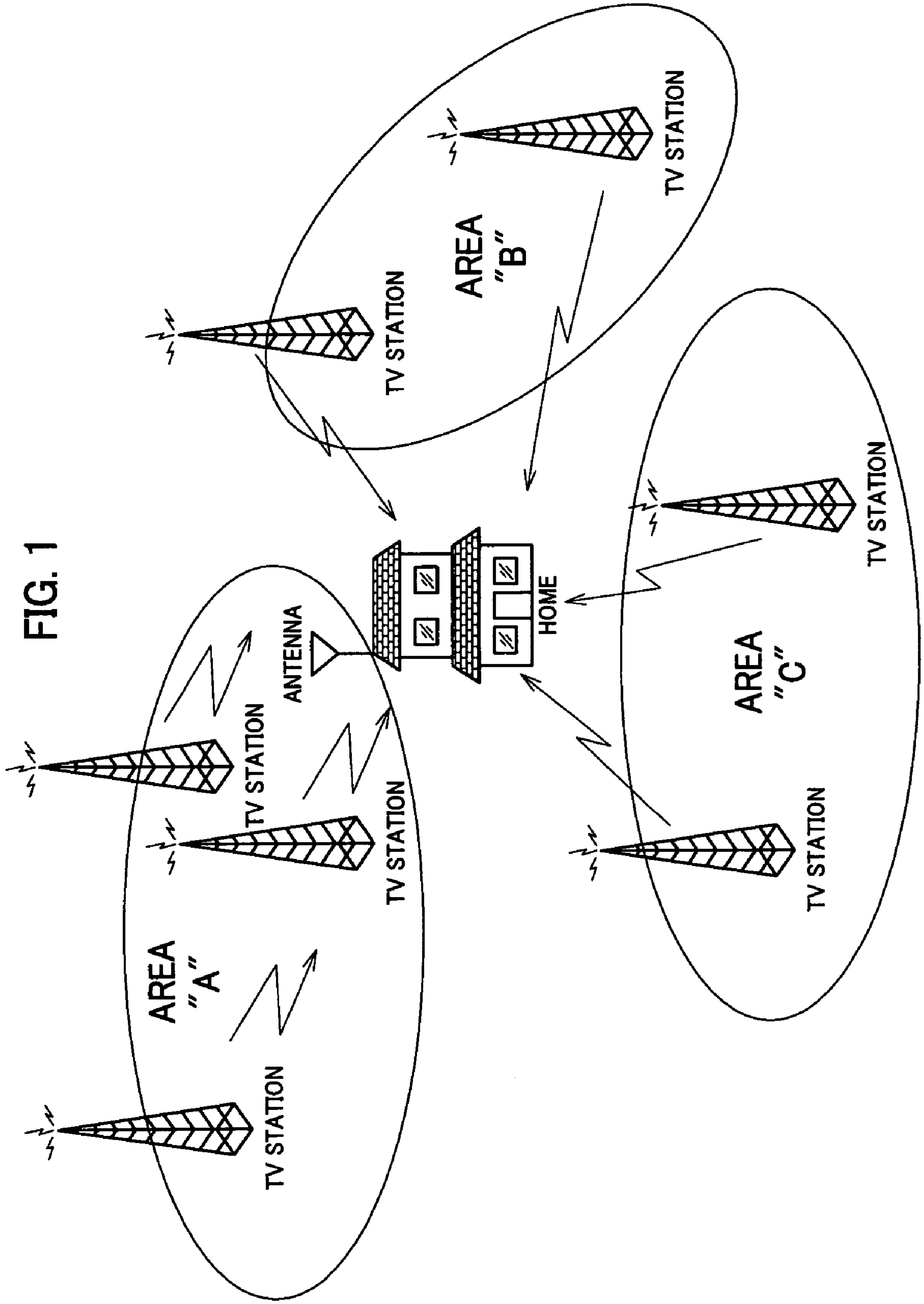
FIG. 1 is a conceptual diagram showing a circumstance for receiving digital television (TV) broadcast signals in home.

A digital TV broadcast signal receiver in accordance with an embodiment of the present invention is described with reference to figures. A circumstance for receiving TV broadcast signals in home is shown in FIG. 1. In an area where grand-based digital TV broadcast is performed, when a sensitivity of received signal of a digital TV broadcast signal is equal to or larger than a predetermined threshold value, an image having a predetermined image quality can be obtained by correction. Thus, it is possible to view TV programs by receiving TV broadcast signals which are delivered from TV stations existing at many positions in such as areas designated by symbols A, B, C, and so on, as shown in FIG. 1. According to such a circumstance, various types of multi-directional antennas called smart antenna having a plurality of signal receiving directions are put into practical use.

As a configuration of the multi-directional antenna, there are many types, for example, for rotating an antenna with a motor for changing the signal receiving direction, or having a plurality of antennas and electronic switches and selecting an effective antenna by switching on and off of the electronic switches. According to the EIA-909 technical standard, it is provided that the multi-directional antenna has sixteen signal receiving directions. A digital TV broadcast signal receiver for receiving digital TV broadcast signals in compliance with the EIA-909 technical standard can switch all of sixteen signal receiving directions with no relation to kind or specification of the multi-directional antenna connected thereto.

In the conventional digital TV broadcast signal receiver, when the signal receiving direction of the multi-directional antenna is switched, a direction having the highest sensitivity of received TV broadcast signal is generally selected as the optimum signal receiving direction with respect to each channel. However, in the digital TV broadcast, when the sensitivity of received digital TV broadcast signal is equal to or larger than a predetermined threshold value, an image having a predetermined picture quality can be obtained. Thus, it is not indispensable to select the optimum signal receiving direction as the signal receiving direction of each channel.

In order to reduce a number of times to switch of the signal receiving direction of the multi-directional antenna, the digital TV broadcast signal receiver in accordance with this embodiment searches the channels, TV broadcast signals of which can be received normally, in each signal receiving directions of the multi-directional antenna. And a signal receiving direction, in which the number of the channels normally receivable is the largest, is decided as an optimum signal receiving direction with respect to each receivable channel.

Figure 2:
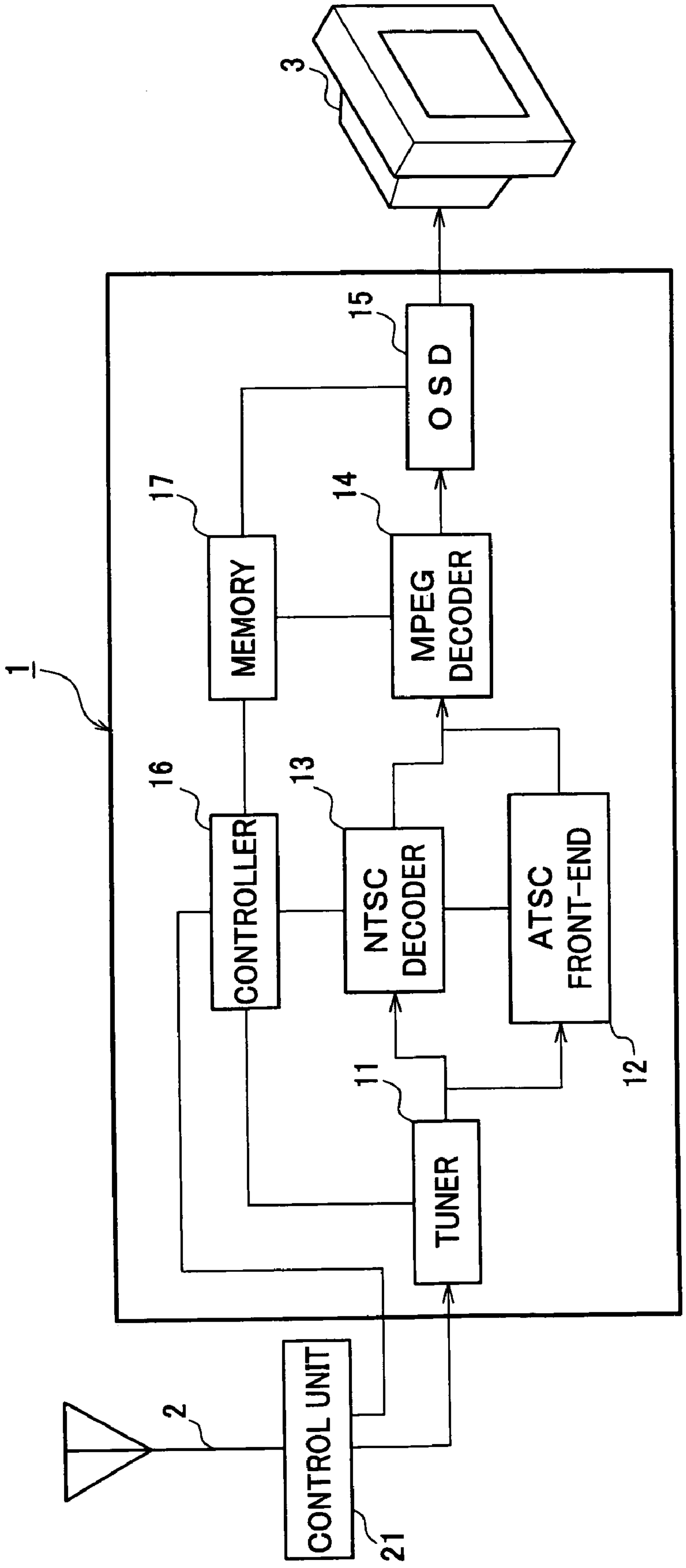
FIG. 2 is a block diagram showing a configuration of a digital TV broadcast signal receiver in accordance with an embodiment of the present invention.

Subsequently, a configuration of the digital TV broadcast signal receiver 1 in accordance with this embodiment is shown in FIG. 2. The digital TV broadcast signal receiver 1 comprises a tuner 11 serving as a TV signal receiving means which is connected to a multi-directional antenna 2, an ATSC front-end 12 serving as a digital signal processing means for processing predetermined signal processing to digital TV broadcast signals received by the tuner 11, and decoding the processed signals, an NTSC decoder 13 for decoding analogue TV broadcast signals received by the tuner 11, an MPEG decoder 14 serving as signal output means for decoding MPEG compressed TV broadcast signals, an on screen display unit (OSD) 15 for superimposing a predetermined display image onto the decoded TV broadcast signals, a controller (CPU) 16 serving as entire control means for sensing signal receiving state of the TV broadcast signals received by the tuner 11, for controlling a control unit 21 of the multi-directional antenna 2 (serving as a signal receiving direction deciding means and control signal output means), and for controlling the ATSC front-end 12, the NTSC decoder 13, and so on, and a memory 17 serving an memory means for temporarily memorizing the decoded TV broadcast signals and for memorizing the display image to be superimposed on the decoded TV broadcast signals. The decoded TV broadcast signals decoded by the MPEG decoder 14 is outputted to a monitor display apparatus 3 through the on screen display unit 15, so that the image is displayed on the screen of the monitor display apparatus 3.

In the digital TV broadcast, data can be transmitted from the digital TV broadcast signal receiver 1 at user side to the TV station. It, however, is nothing to the present invention directly, so that the description of it is omitted.

The control unit 21 of the multi-directional antenna 2 makes only one signal receiving direction among a plurality of the signal receiving directions, which is chosen by the controller 16, effective, corresponding to the control signal outputted from the controller 16. When the multi-directional antenna 2 rotates an antenna with a motor in order to change the signal receiving direction, the control unit 21 controls the motor to orientating the antenna corresponding to the direction selected by the controller 16. Alternatively, when the multi-directional antenna 2 switches on and off of electronic switches in order to switch the effective direction of the antenna, the control unit 21 switches on only one electronic switch corresponding to the direction selected by the controller 16 and off the other electronic switches.

Figure 3:
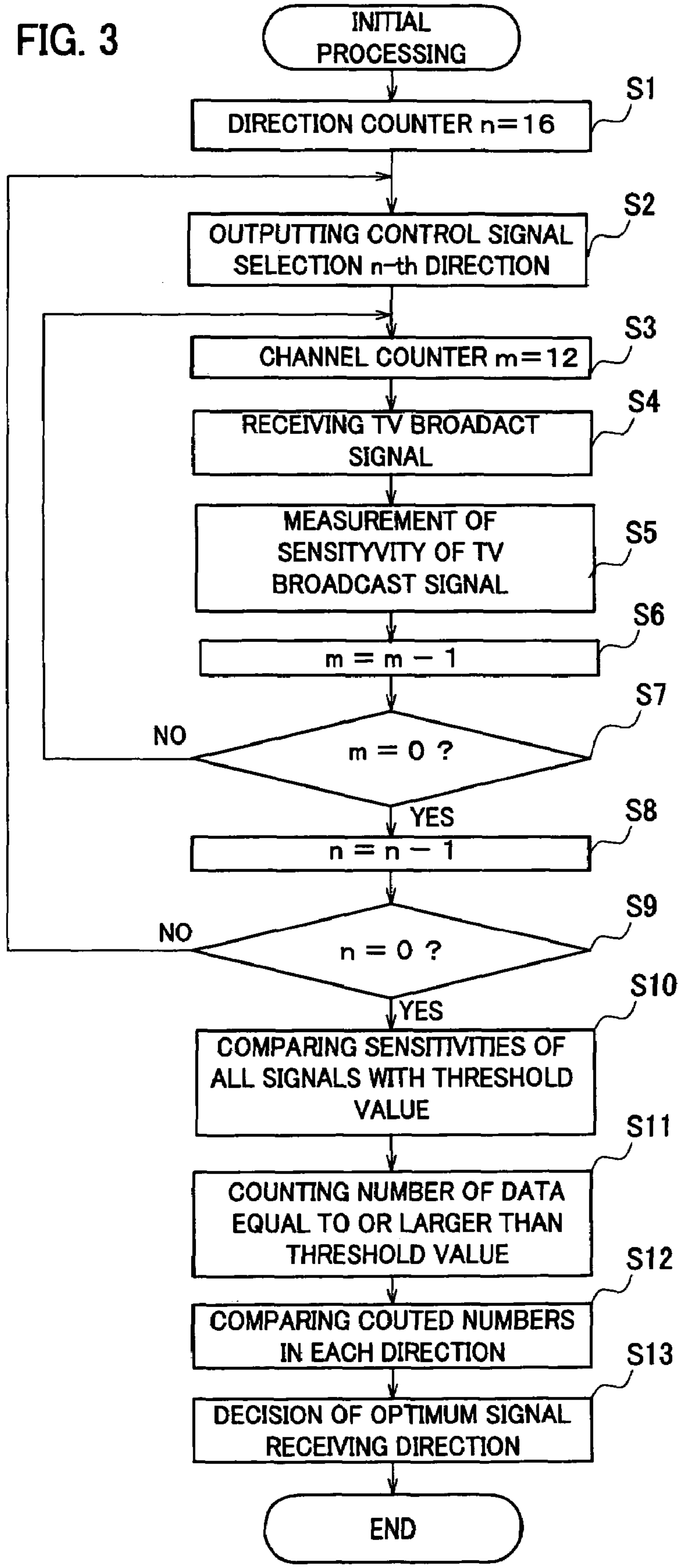
FIG. 3 is a flowchart showing a process for deciding an optimum signal receiving direction of a multi-directional antenna with respect to each channel in the digital TV broadcast signal receiver.

Subsequently, a decision of the optimum signal receiving direction of the multi-directional antenna 2 with respect to each receivable channel through the controller 16 of the digital TV signal receiver 1 is described with reference to a flowchart shown in FIG. 3.

When the controller 16 senses that the multi-directional antenna 2 is connected to the tuner 11, the controller 16 performs an initial processing for setting the optimum signal receiving direction of the multi-directional antenna 2 with respect to each channel which is receivable through the multi-directional antenna 2. The controller 16 sets a numeric value n=16 in a direction counter (S1), and outputs a control signal for selecting the n-th direction among a plurality of the signal receiving direction of the multi-directional antenna 2 (S2). After outputting the control signal to the control unit 21 of the multi-directional antenna 2, the controller 16 further sets, for example, a numeric value m=12 in a channel counter (S3). After passing a term necessary for switching the signal receiving direction of the multi-directional antenna 2, the TV broadcast signal of the m-th channel is received through the tuner 11 (S4). When the TV broadcast signal of the m-th channel is received, the controller 16 measures sensitivity of received TV broadcast signal of the m-the channel, and memorizes a measurement result into the memory 17 (S5). Subsequently, the controller 16 subtracts a value one from the numeric value of the channel counter (S6), and judges whether the measurement of the sensitivity of the digital TV broadcast signals with respect to all of the twelve channels has been completed or not (S7). When the measurement of the sensitivity of the TV broadcast signals with respect to all of the twelve channels has not been completed, the controller 16 returns to the step S3 and measures the sensitivity of the digital TV broadcast signal with respect to next channel ((m-1)-th channel). Alternatively, when the measurement of the sensitivity of the TV broadcast signals with respect to all of the twelve channels has been completed (YES in S7), the controller 16 subtracts a value one from the numeric value of the direction counter (S8), and judges whether the measurement of the sensitivities of the digital TV broadcast signals with respect to each channel in all of sixteen signal receiving directions has been completed or not (S9). When the measurement of the sensitivities of the digital TV broadcast signals with respect to all the receivable channels in all of sixteen signal receiving directions has not been completed, the controller 16 returns to the step S2, and measures the sensitivities of the digital TV broadcast signals with respect to all the receivable channels in next signal receiving direction ((n-1)-th direction).

When the measurement of the sensitivities of the digital TV broadcast signals with respect to all the receivable twelve channels in all the sixteen signal receiving directions has been completed (YES in S9), the controller 16 reads out the measured data memorized in the memory 17 and compares all the measured values of the sensitivities with a predetermined threshold value (S10). Then, the controller 16 counts number of data showing the values larger than the threshold value with respect to each of the sixteen signal receiving directions (S11). Subsequently, the controller 16 compares the counted numbers with respect to the signal receiving directions (S12). Finally, the controller 16 decides a signal receiving direction showing the largest counted number as the optimum signal receiving direction with respect to each channel (S13).

An example of the sensitivity of the digital TV broadcast signal of each channel in each signal receiving direction described in the above-mentioned steps S10 to S13 is shown in the table 1.

TABLE 1

| DIRECTION | 2ch | 4ch | 6ch | 8ch | 10ch | 12ch | COUNTING |
|---|---|---|---|---|---|---|---|
| 1 | 40% | 10% | 10% | 90% | 100% | 10% | 3 |
| 2 | 50% | 10% | 10% | 70% | 70% | 10% | 3 |
| 3 | 80% | 10% | 20% | 50% | 50% | 20% | 3 |
| 4 | 50% | 10% | 40% | 40% | 40% | 10% | 4 |
| 5 | 40% | 20% | 60% | 30% | 10% | 10% | 2 |
| 6 | 20% | 10% | 70% | 30% | 10% | 10% | 1 |
| 7 | 10% | 10% | 60% | 40% | 10% | 10% | 2 |
| 8 | 10% | 10% | 40% | 60% | 20% | 10% | 2 |
| 9 | 10% | 10% | 20% | 40% | 40% | 40% | 3 |
| 10 | 20% | 10% | 10% | 30% | 20% | 60% | 1 |
| 11 | 30% | 10% | 20% | 30% | 10% | 70% | 1 |
| 12 | 10% | 40% | 30% | 40% | 10% | 60% | 3 |
| 13 | 20% | 60% | 20% | 50% | 10% | 40% | 3 |
| 14 | 10% | 40% | 10% | 70% | 40% | 20% | 3 |
| 15 | 10% | 10% | 10% | 90% | 50% | 10% | 2 |
| 16 | 20% | 10% | 10% | 100% | 70% | 0% | 2 |

In the table 1, it is assumed that the threshold value is set to be 40%, and the channel showing the sensitivity equal to or larger than 40% is normally receivable. For example, attending to the sixth channel (6ch), the TV broadcast signal can be received normally in five signal receiving directions of fourth, fifth, sixth, seventh and eighths directions designated by numerals 4, 5, 6, 7 and 8. On the other hand, in the fourth signal receiving direction designated by numeral 4, four TV broadcast signals of the second, sixth, eighths and tenth channels can be received normally. In the fifth signal receiving direction designated by numeral 5, two TV broadcast signals of the second and sixth channels can be received normally. In the sixth signal receiving direction designated by numeral 6, only one TV broadcast signal of the sixth channel can be received normally. In the seventh signal receiving direction designated by numeral 7, two TV broadcast signals of the sixth and eighth channels can be received normally. In the eighths signal receiving direction designated by numeral 8, two TV broadcast signals of the sixth and eighth channels can be received normally. Accordingly, the optimum signal receiving direction with respect to the sixth channel is decided as the fourth signal receiving direction showing the largest number of the receivable channels, instead of the sixth signal receiving direction showing the largest value of the sensitivity of the TV broadcast signal of the sixth channel. By such a decision of the optimum signal receiving directions, even when the channels are reshuffled among the second, sixth, eighth and tenth channels, it is no need to switch the signal receiving direction of the multi-directional antenna 2. Thus, the controller 16 outputs no control signal to the control unit 21 of the multi-directional antenna.

On the other hand, when the channel is switched from the sixth channel to the fourth channel, the controller 16 outputs a control signal to switch the signal receiving direction of the multi-directional antenna 2 from the sixth signal receiving direction to the thirteenth signal receiving direction. However, in the thirteenth signal receiving direction, the TV broadcast signals of the eighths and twelfth channels can be received normally, further to that of the fourth channel. Thus, it is no need to switch the signal receiving direction of the multi-directional antenna 2, even when the channels are reshuffled among the fourth, eighth and twelfth channels. Consequently, the switching number of times for switching the signal receiving direction of the multi-directional antenna 2 can be reduced according to the digital TV broadcast signal receiver 1. Especially, even when the user reshuffles the channel frequently, the time delay between the channel choice by the user and the switching operation of the signal receiving direction of the multi-directional antenna 2 can be shortened.

As can be seen from the table 1, three TV broadcast signals including the fourth channel can be received in the twelfth, thirteenth and fourteenth signal receiving directions. In such a case, it is possible to decide a signal receiving direction, for example, the thirteenth signal receiving direction showing the highest sensitivity of the fourth channel as the optimum signal receiving direction of the fourth channel.

This application is based on Japanese patent application 2004-132340 filed Apr. 28, 2004 in Japan, the contents of which are hereby incorporated by references.

Although the present invention has been fully described by way of example with reference to the accompanying drawings, it is to be understood that various changes and modifications will be apparent to those skilled in the art. Therefore, unless otherwise such changes and modifications depart from the scope of the present invention, they should be construed as being included therein.

What is claimed is:

1. A digital television broadcast signal receiver connected to a multi-directional antenna having a plurality of signal receiving directions in compliance with a predetermined technical standard, receiving a digital television broadcast signal by making only one signal receiving direction among a plurality of signal receiving directions effective, comprising:

a tuner for receiving digital television broadcast signal through the multi-directional antenna;

a controller for switching signal receiving directions of the multi-directional antenna, searching channels normally receivable in each signal receiving direction of the multi-directional antenna while switching the signal receiving directions of the multi-directional antenna, comparing a number of channels normally receivable in each signal receiving direction, and deciding a signal receiving direction having the largest number of other channels normally receivable in the same signal receiving direction as an optimum signal receiving direction with respect to each channel.

2. The digital television broadcast signal receiver in accordance with claim 1, wherein the controller measures a sensitivity of digital television broadcast signal of each channel, compares a value of measured sensitivity with a predetermined threshold value, and decides the channel normally receivable when the value of measured sensitivity is equal to or larger than the threshold value.

3. The digital television broadcast signal receiver in accordance with claim 1, wherein the controller counts a number of channels normally receivable in each signal receiving direction, compares the numbers of channels normally receivable including a channel to which an optimum signal receiving direction is to be decided, and decides a signal receiving direction showing the largest number of channels normally receivable as the optimum signal receiving direction of the channel.

4. The digital television broadcast signal receiver in accordance with claim 1, wherein when the channel is switched by a user, the controller judges whether the channel to be switched is normally receivable in the signal receiving direction set before the channel is switched, or not;

when the channel to be switched is normally receivable, the controller does not switch the signal receiving direction of the multi-directional antenna, and when the channel to be switched is not normally receivable, the controller switches the signal receiving direction of the multi-directional antenna to the optimum signal receiving direction of the channel to be switched.

5. A digital television broadcast signal receiver, to which a multi-directional antenna having a plurality of signal receiving directions in compliance with a predetermined technical standard, receiving a digital television broadcast signal by making only one signal receiving direction among a plurality of signal receiving directions effective, comprising:

a control signal output means for outputting a control signal for directing a signal receiving direction to the multi-directional antenna so as to receive a television broadcast signal;

a television broadcast signal receiving means connected to the multi-directional antenna for receiving a digital television broadcast signal;

a digital signal processing means for performing a predetermined signal processing to the digital television broadcast signal received by the television broadcast signal receiving means;

a signal output means for outputting a signal processed by the digital signal processing means to a monitor display apparatus;

a memory means for temporarily memorizing the signal processed by the digital signal processing means;

a signal receiving direction deciding means for deciding an optimum signal receiving direction with respect to each receivable channel with using the signals memorized in the memory means; and an entire control means for controlling each component of the digital television broadcast signal receiver, and wherein when the multi-directional antenna is connected to the tuner, the control signal output means outputs control signals at a predetermined interval for switching the signal receiving direction of the multi-directional antenna serially to one of a plurality of the signal receiving directions;

the television broadcast signal receiving means searches receivable channels and receives a digital television broadcast signal of each receivable channel in each signal receiving directions of the multi-directional antenna at the predetermined interval;

the digital signal processing means performs a predetermined signal processing to the digital television broadcast signal of each channel in each signal receiving direction, obtains data of sensitivity of each digital television broadcast signal, and memorizes the data of sensitivity into the memory means;

the signal receiving direction deciding means compares each data of sensitivity memorized in the memory means with a predetermined threshold value, counts a number of data of sensitivity showing a value equal to or larger than the threshold value in each signal receiving direction, further compares counted number in each signal receiving direction with each other, and decides a signal receiving direction of largest counted number among signal receiving directions in which the data of sensitivity shows a value equal to or larger than the threshold value as an optimum signal receiving direction with respect to each channel;

when the channel is switched by a user, the signal receiving direction deciding means judges whether the data of sensitivity of a channel to be switched in a signal receiving direction set before the channel is switched is equal to or larger than the threshold value or not; and when the data of sensitivity of the channel to be switched is equal to or larger than the threshold value, the control signal output means outputs no control signal to the multi-directional antenna, and when the data of sensitivity of the channel to be switched is smaller than the threshold value, the control signal output means outputs a control signal to the multi-directional antenna so as to switch the signal receiving direction of the multi-directional antenna to an optimum signal receiving direction of the channel to be switched.

* * * * *